United States Patent [19]

Rose

[11] Patent Number: 5,198,652
[45] Date of Patent: Mar. 30, 1993

[54] METHOD FOR MANUFACTURING A MEMORY CARD CAPABLE OF RECEIVING A PHOTOGRAPHIC IMAGE, AND CARD THUS OBTAINED

[75] Inventor: René Rose, Voisin-Le-Bretonneux, France

[73] Assignee: Schlumberger Industries, Montrouge, France

[21] Appl. No.: 774,779

[22] Filed: Oct. 9, 1991

[30] Foreign Application Priority Data

Oct. 19, 1990 [FR] France .................................. 90 13001

[51] Int. Cl.⁵ .......................................... G06K 19/00
[52] U.S. Cl. ...................................... 235/492; 235/488
[58] Field of Search ............................. 235/492, 488

[56] References Cited

U.S. PATENT DOCUMENTS

| | | | |
|---|---|---|---|
| 3,546,748 | 12/1970 | Gardner | 283/77 |
| 4,625,102 | 11/1986 | Rebjock et al. | 235/492 |
| 4,675,516 | 6/1987 | Guion | 235/441 |
| 4,737,620 | 4/1988 | Mollett et al. | 235/492 |
| 4,822,990 | 4/1989 | Tamada et al. | 235/492 |
| 4,873,425 | 10/1989 | Langlais et al. | 235/441 |
| 4,902,233 | 2/1990 | Maillot | 439/62 |
| 4,961,893 | 10/1991 | Rose | 264/247 |
| 5,030,407 | 7/1991 | Mollet et al. | 264/261 |

FOREIGN PATENT DOCUMENTS

| | | |
|---|---|---|
| 981303 | 1/1976 | Canada . |
| 0340099 | 2/1989 | European Pat. Off. . |
| 0412893 | 2/1991 | European Pat. Off. . |
| 0262036B1 | 5/1991 | European Pat. Off. . |
| 2145135 | 2/1973 | France . |
| 2435357 | 4/1980 | France . |
| 0254640A1 | 1/1988 | France . |
| 2605144 | 4/1988 | France . |
| 0371855A1 | 6/1990 | France . |

Primary Examiner—Constantine Hannaher
Assistant Examiner—Don Wong
Attorney, Agent, or Firm—Frishauf, Holtz, Goodman & Woodward

[57] ABSTRACT

A memory card capable of receiving a photographic image on its back. A photographic substrate, comprising a photographic film, a photographic developing paper and a protection sheath are placed on an internal wall of a mold. A plastic material is injected into a cavity of the mold and thus constitutes the body of the card, to which the posterior face of the photographic substrate adheres.

14 Claims, 2 Drawing Sheets

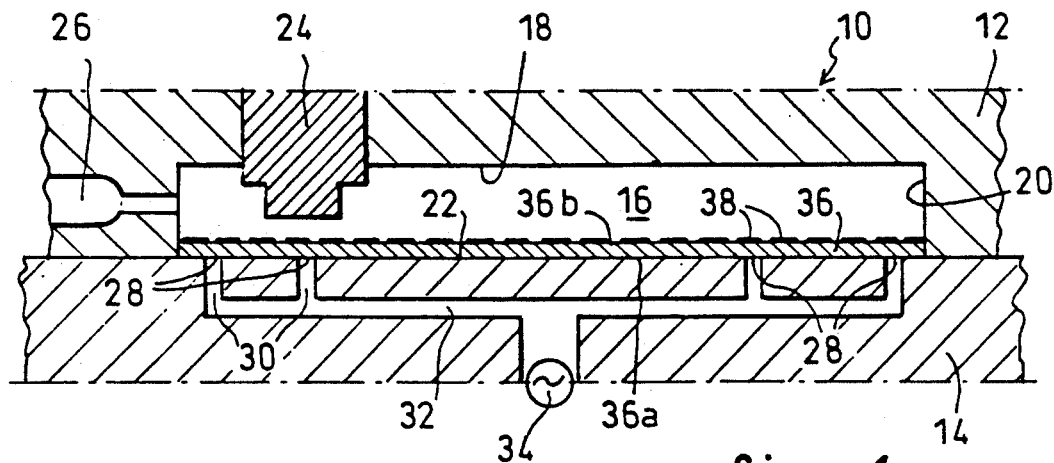
fig_1
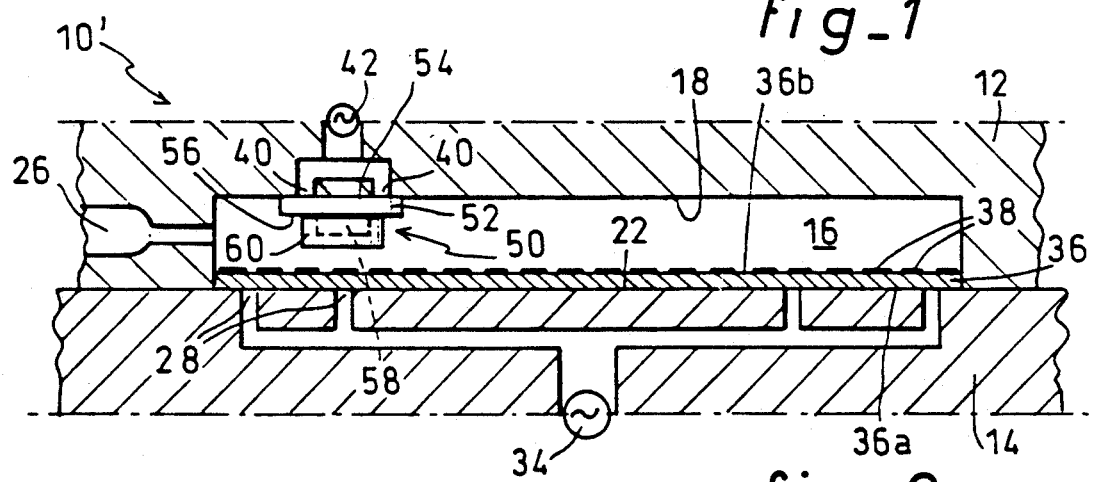
fig_2
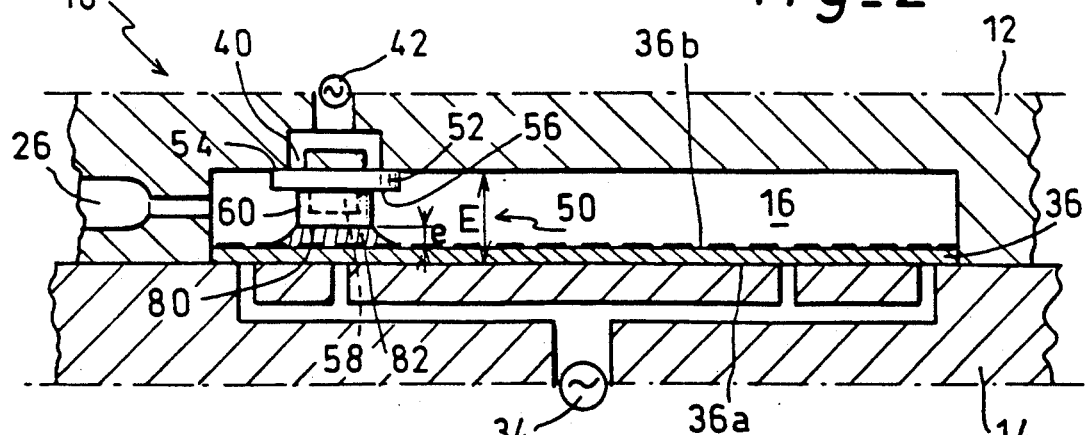
fig_3

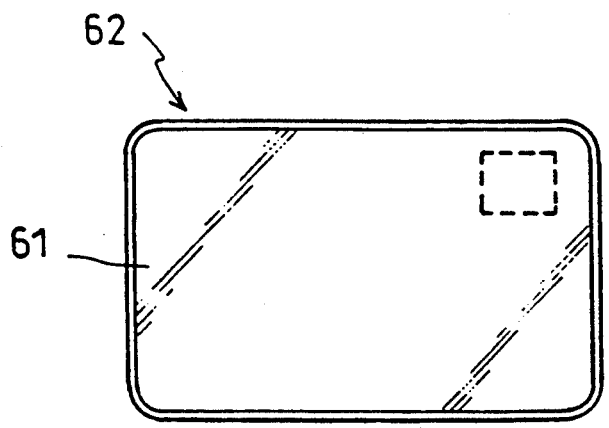
fig_4
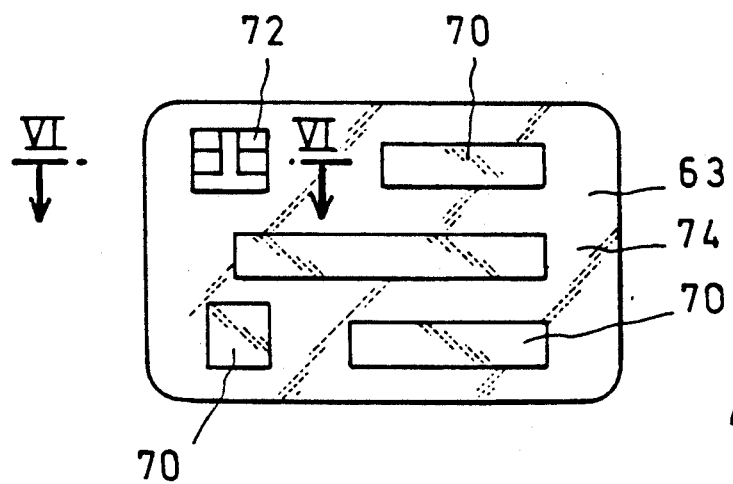
fig_5
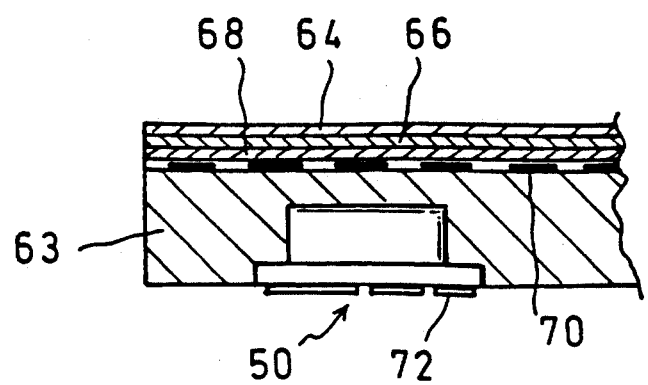
fig_6

METHOD FOR MANUFACTURING A MEMORY CARD CAPABLE OF RECEIVING A PHOTOGRAPHIC IMAGE, AND CARD THUS OBTAINED

BACKGROUND OF THE INVENTION

The present invention is directed to a method of manufacturing a memory card that can retain a photographic image, and to memory cards obtained with this method.

Memory cards are very widely used at present, and they can be divided into two classes depending on the nature of their memory element. The first class of cards includes those in which the memory for storing information is constituted by one or more magnetic tracks, or one or more optical recording substrates, secured to the body of the card. Memory cards of the second class are called electronic memory cards, and each includes electronic integrated circuits, also known as an electronic module, having memory circuits as well as circuits for controlling operation of the memory circuits. In this second class of cards, an integrated circuit may also include electronic data processing circuits for processing the information stored in the memory circuits.

For this second type of card, there are two broad categories of transmission of information between the electronic circuits of the card and a card reader. In the first transmission mode, the card includes external electric contact tabs connected to the electronic circuits. These tabs can be placed in contact with a connector of the card reader. These tabs serve to transmit information between the reader and the circuits of the card, and to supply electrical energy to the circuits of the card, since typically the card itself has no power supply of its own. A second mode of communication with the card reader comprises making an inductive coupling between the circuits of the card and the card reader to enable transmission of information and of the electrical energy necessary to power the circuits of the card.

The present invention relates preferentially to electronic memory cards but, as will be explained later, it also applies to memory cards with magnetic or optical tracks.

Memory cards, whether they are electronic or have magnetic or optical tracks, are currently used in a great many ways, such as to pay for telephone communications, to manage banking operations, or for access control. In this last case, whether the card is an electronic memory or one with a magnetic or optical track, its memory includes a confidential number that enables access to certain premises or possibly to certain services. To gain access to the protected premises, the card holder is required to introduce a confidential number, related to the one memorized in the card, into a card reader located at the entrance to the protected premises. However, to further improve access control, it is often necessary for the card, which is frequently called a badge, to include not only the confidential access number but also a clear photograph of the badge holder.

To make such a badge, that is, a card with a photograph of the holder, a card is generally first made with a conventional card body and a memory element, either a magnetic or an optical track, or an electronic module. Then, a photograph of the badge holder is made, and this photograph is fixed to the back of the card body. It is absolutely necessary that this fixation be both irreversible and, of course, feasible. These operations are tedious in all cases, and it is always tricky to glue the photograph to the back of the card.

Furthermore, when the badge must be issued to a visitor at the security station of a controlled area, the operations required —that is, taking the photograph, developing it, and gluing the photograph to the back of the card—are time-consuming and hence annoying to the visitor. These problems mean that a visitor is often simply admitted without such a card, with the attendant degradation in monitoring efficiency.

SUMMARY OF THE INVENTION

To overcome these disadvantages, one object of the invention is to provide a method of producing memory cards capable of retaining a photographic image that avoids the complicated operations described above, thus affording much greater flexibility in the use of memory badges provided with a photograph of the holder.

According to one aspect of the invention, a method is provided for producing a memory card that includes a memory element and a card body having two main, substantially parallel faces. One of the main faces is provided with a photographic substrate.

A photographic substrate having one sensitive face and having substantially the same peripheral dimensions as the main faces is provided. The photographic substrate is disposed in a cavity of a mold. The cavity has the shape of the card body to be made. The sensitive face of the photographic substrate is held against one of the inner walls of the cavity of the mold that defines one main face of the card body. A plastic material is injected under pressure into the mold in such a manner that it fills the entirety of the cavity and that it adheres to the other face of the photographic substrate. The object thus obtained is unmolded, and the memory element is affixed to the other main face of the card body.

With this method, a memory card is obtained that has the characteristics of standard cards, but the back of such cards also includes a photographic substrate already fixed nondetachably on the card body. To be able to issue a badge to a visitor, it suffices to place the card in a camera, expose and develop the photographic substrate, and store the confidential access number into the card memory.

In a variant of the above-described method of the invention, a memory element is also disposed in the cavity of the mold in such a manner that its access face is held against the internal wall of the cavity of the mold that defines the other main face of the card body. When the card is unmolded, a complete card is thus obtained, since the memory element has been fixed directly to the card body during the molding operation.

The invention also relates to memory cards of the type obtained by employing the methods as described above.

Further characteristics and advantages of the invention will become more apparent from the ensuing detailed description of several embodiments of the invention, given by way of non-limiting examples, taken in conjunction with the accompanying drawings.

BRIEF DESCRIPTION OF THE DRAWINGS

FIG. 1 is a vertical sectional view of a mold that can be used to make a card body in accordance with a first embodiment of the invention;

FIG. 2 is a view similar to that of FIG. 1, but corresponding to a second embodiment of the invention;

FIG. 3 is a view similar to those of FIGS. 1 and 2, but corresponding to a third embodiment of the invention;

FIG. 4 is a top view of the back of an electronic memory card obtained by employing the method of FIG. 2 or FIG. 3;

FIG. 5 is a top view of the front of the card of FIG. 4; and

FIG. 6 is a fragmentary view in vertical section taken along the line VI—VI of FIG. 5.

DETAILED DESCRIPTION OF THE INVENTION

Before the invention is described in detail, a brief review will be made of what constitutes an electronic memory card. Numerous patents have already described the arrangement of such cards, and they therefore need not be described in detail here. The card is constituted by a card body having the following standard dimensions: 0.8 mm in thickness, 85 mm in length, and 55 mm in width. This card body, which must also meet the specifications of the ISO Standard 7810, is most often made of a plastic material, in particular so as to meet standards relating to the bending characteristics of the card body. Further details of this standard, are disclosed in French patent application No. 86/14231, filed Oct. 14, 1986 which also describes a technique for making a card body by injection molding. The card also includes an electronic module affixed in the card body. This electronic module is constituted primarily by one or more integrated circuits made in one or more semiconductor contact assemblies. These integrated circuits form the memory circuits, and in certain cases also form information processing circuits. In the particular case of electronic memory cards which come into ohmic contact with the reader, the semiconductor contact assembly or assemblies are affixed to a substrate which on its outer face, or in other words its face turned toward the exterior of the card body, includes electrical contact tabs for assuring completion of an electrical connection with the card reader when the card is introduced into it. Card readers of this kind are described for instance in U.S. Pat. Nos. 4,675,516, 4,902,233 and 4,873,425. The electronic module also certainly includes electrical connections to the external contact tabs, as well as a coating material that protects the integrated circuit and the electrical connections before they are implanted in the card body. Such electrical modules are also well known per se and are described in particular in the following patents: U.S. Pat. Nos. 4,625,102 and 4,737,620, and European Patent Applications 0 254 640 and 0 371 855. The invention also relates to the case where the card includes a plurality of separate electronic modules. One such arrangement is described in European Patent Application 0 262 036.

In FIG. 1, a mold 10 is shown for making an electronic memory card in accordance with a first embodiment of the invention. The mold includes a fixed part 12 and a movable part 14. The fixed part 12 defines part of the internal cavity or recess 16 of the mold, and more precisely it defines one of the main faces 18 and the lateral face 20. The movable part 14 defines the second main face 22. The cavity 16 thus defined reproduces exactly the outer shape of the card body to be made. The fixed part 12 includes a core 24 that projects into the main face 18, so that when the card body is made it defines a cavity used for the placement and fixation of the electronic module of the card. The fixed part 12 also includes an injection nozzle 26. Only a single injection nozzle 26 is shown in this drawing figure, but it is self-evident that the mold can have more of them. The movable part 14, in its main face 22, includes a plurality of openings such as 28, which are connected to branch conduits 30 that in turn are connected to a vacuum pump 34 via the main conduit 32.

The way in which a card body according to the invention is made with the aid of the mold 10 will now be described. When the mold is open, in other words when parts 12 and 14 of the mold are separated, a fast-development photographic substrate 36 is put in place on the face 22 of part 14. This photographic substrate is, in fact, constituted in a known manner by a protection sheet, a photographic film, and a photographic developing paper sequentially stacked one on another. Preferably, the face 36b of the developing paper is covered with indicia 38. Such indicia can take the form of alphanumeric characters or graphical elements of any type, such as company logos, desired patterns and the like. Face 36a is called the sensitive face. Before this substrate 36 is placed on the face 22 of the mold, the pump assembly 34 is started up in such a way that the suction at the openings 28 maintains the photographic substrate 36 in position, with its sensitive face 36a pressed against an internal wall 22 of the mold. The mold 10 is then closed, and a suitable plastic material is injected into the cavity 16 via the injection nozzle 26. This plastic material may be transparent acrylonitrile butadiene styrene (ABS). Injection continues until the plastic material fills the entirety of the cavity 16. Simultaneously, the plastic material adheres to the posterior face 36b of the photographic substrate. After suitable cooling, the mold is opened, and a card body is removed that has the photographic substrate 36 on its back and a plane face on its front, into which plane front face a cavity corresponding to the shape of the core 24 opens.

It can be seen that a card body is thus obtained that includes the photographic substrate and with which a ready-to-use electronic memory card is obtained simply by putting an electronic module into place and affixing it.

Referring now to FIG. 2, a second embodiment of an electronic memory card will now be described. The mold 10' used is identical to the mold 10 of FIG. 1, except for the following details. The core 24 projecting into the face 18 of the part 12 of the mold is replaced with suction holes 40 connected to a vacuum pump system 42.

The process of manufacturing the electronic memory card with the aid of the mold 10' will now be described. As already noted in conjunction with FIG. 1, the photographic substrate 36 is put in place against the wall 22 of the mold, and the vacuum pump 34 is actuated in order to hold the photographic substrate 36 against this wall, with its sensitive face 36a pressed against it. With the aid of a micromanipulator, an electronic module 50 is then put in place against the wall 18 of the mold part 12, facing the suction holes 40, and then the pump assembly 42 is started up in order to hold the electronic module 50 pressed against the wall 18 in a suitable position. The electronic module 50 is shown schematically. Its printed circuit or the like 52 is shown, which includes the external electrical contact tabs (not shown) on its access face 54. The integrated circuit 58 has also been shown, solidly attached to the second face 56 of the printed circuit 52 and embedded in a coating material 60 that is solidly attached to the printed circuit 52.

After the photographic substrate 36 and the electronic module 50 have been put in place the mold is closed, and the plastic material is then injected through the injection nozzle 26. As in the preceding embodiment, the injection material is preferably ABS or transparent polycarbonate. After the injection material has completely filled the cavity 16 of the mold and the material has adhered both to the posterior face 36b of the photographic substrate and to the external walls of the electronic module 50, except of course for the access face 54, the unit is left to cool and is then unmolded. One thus obtains a complete electronic memory card, which is shown in FIGS. 4-6.

FIG. 4 shows the rear 61 of the card 62. This rear is constituted by the photographic substrate 36. The photographic substrate 36 of course has exactly the same shape and peripheral dimensions as the main faces of the card body 62. FIG. 6 shows in greater detail how the photographic substrate 36 is constituted. From its outer face, known as the sensitive face 36a, to its posterior face 36b, it includes: a detachable protection layer 64, a photographic film 66, and a developing paper 68. Thus the typical elements of fast-development photographic film (i.e. instant photography) are found. In the embodiment described, the back of the developing paper 68 also includes a certain number of indicia 70. Indicia 70 can be of a type similar to indicia 38 described above. FIG. 6 also shows the electronic module 50 which is embedded in the body 62 of the card, except for its access face constituted by the external electrical contact tabs, such as 72. FIG. 5 shows the front 74 of the card body 62. FIG. 5 shows the external contact tabs 72 of the electronic module 50 and the indicia elements 70 already described in conjunction with FIG. 6. It will be recalled that the injection material constituting the body 62 of the card is transparent. Thus the indicia 70 disposed on the face 36b of the photographic film substrate appear on the front face 74 of the card. Considering the slight thickness of the card body, which is 0.8 mm, the indicia 70 are not altered by the layer of transparent material, and the parallax effect is negligible considering this slight thickness.

It will be seen that with the invention, a card is obtained that has a front 74 identical to conventional cards, with its set of external contact tabs 72 and indicia 70, and the back of which includes a fast-development photographic film unit ready for use, and which is fixed nondetachably to the back of the card body 62 at the time of the molding.

To personalize the card thus obtained, or in other words to adapt it to a particular holder, it suffices to introduce the card into a fast-development camera. When the holder's picture is taken, the protection layer 64 is lifted off and the image is formed on the photographic film 66; then, by well known fast-development techniques, this image is transferred to the developing paper 68, where the photograph is fixed. Simultaneously or with the aid of some other apparatus, the electronic circuit of the electronic module 50 is programmed to introduce the confidential identification information into it and possibly other information as well, such as a personal description and various kinds of premises to which the card holder may gain access by presenting the card and introducing it into a corresponding card reader. During this programming, it is also possible, depending on the type of electronic circuit used, to introduce elements for programming the processing circuits of the electronic module that will later make it possible, for example, to record the dates of access to various premises, as well as the reference data for the premises to which the card holder has had access.

It is thus seen that the method according to the invention makes it possible to produce cards that can be used directly, without requiring operations of gluing a photograph to the back of the card. This arrangement also makes it possible to avoid any mistake in the relationship that necessarily exists between the photographic image on the back of the card and the programming elements and information stored in the memory of the electronic module 50 of the card.

FIG. 3 illustrates a third embodiment of the invention. The mold 10" used is identical to the mold 10' of FIG. 2. It will accordingly not be described again. The method is distinguished from that of FIG. 2 by the way in which the electronic module 50 and photographic substrate 36 are put in place in the mold 10". In a first step, the electronic module 50 is affixed by its face 80, opposite to its face 54 that includes the external electrical contact tabs, onto the face 36b of the photographic substrate 36. The module 50 must of course be suitably placed with respect to the photographic substrate 36, which also defines the main posterior face of the card. The fixation is done with the aid of a layer 82 of adhesive material, the thickness e of which is such that the thickness E of the unit formed by the photographic substrate 36 and the electronic module 50 is very slightly greater than the final thickness of the card body.

With the mold 10" open, the unit that has just been described is introduced into it. The sensitive face 36a of the photographic substrate 36 is pressed against the wall 22 of the mold, and the suction system 34 is started up. The mold is then closed. The contact between the wall 18 of the mold and the access face 54 of the electronic module 50 causes a slight crushing of the layer 82 of adhesive, for the reasons given above. The face 54 of the electronic module is located facing the suction holes 40. The pumping system 42 is started up in turn. Finally, injection of the transparent plastic material under pressure via the nozzle 26 is performed.

The advantage of this third embodiment is that the electronic module is already positioned with respect to the photographic substrate, and that the placement of the photographic substrate and electronic module in the mold is done in a single manipulation. The card obtained is identical to that shown in FIGS. 4-6.

In the case where making a card with a magnetic or optical track is desired, the mold 10 of FIG. 1 is advantageously used, but with the core 24 omitted. Beginning with the card body thus obtained by molding, the magnetic or optical track or tracks are then affixed, by any suitable known means, to the front 74 of the card body.

In a variant, the card may also be made with its magnetic or optical track affixed directly to the card body by molding. To do so, the mold 10' of FIG. 2 is used. The photographic substrate is put in place against the wall 22 of the mold, and the magnetic or optical track is put in place against the wall 18 of the mold, being kept in place by suitably arranged suction holes, such as 40. Next, the injection of the plastic material is performed. The magnetic track may also be made in the mold by a known hot transfer technique under pressure.

In the embodiments described above, it has been assumed that the molding material is transparent and that the back of the photographic substrate includes indicia that is visible through the transparent card body. However, it is readily apparent that the invention is equally applicable to the case where the molding material is not transparent, for example being white. In that case, the photographic substrate no longer includes indicia on its back, and instead, indicia must then be provided on the front of the card body, by any suitable technique.

Although preferred embodiments of the present invention have been described in detail above, various modifications thereto will be readily apparent to one with ordinary skill in the art. All such modifications are intended to be within the scope of the present invention as defined by the following claims.

I claim:

1. A method for producing a memory card including an electronic module and a card body having first and second main, faces, comprising the steps of:

providing a photographic substrate with the same peripheral dimensions as said main faces and having a sensitive face and an opposed face;

providing a mold with a cavity which has the shape of the card body to be made, and with opposed inner walls of said cavity forming said first and second main faces of the card body;

disposing said photographic substrate in the cavity of said mold in such a manner that its sensitive face is held against the one of said opposed inner walls of the cavity that defines the first main face of the card body;

injecting a plastic material under pressure into the mold in such a manner that it fills the entirety of said cavity and that it adheres to the opposed face of the photographic substrate;

unmolding the object thus obtained; and affixing an electronic module to the second main face of said card body.

2. The method of claim 1, further comprising the step of providing one of the opposed inner walls of the cavity of the mold defining the second main face of the card body with a projecting portion to define a recess in said card body, and affixing said electronic module in said recess by said affixing step in such a manner that an access face of said electronic module is disposed substantially in the same plane as the second main face of the card body.

3. The method of claim 1, wherein said photographic substrate is of the fast-development type and includes a developing paper, a photographic film, and a protection element sequentially stacked on one another, said photographing film and said protection element being detachable from said developing paper.

4. The method of claim 3, wherein said plastic injection material is transparent, and the back of said developing paper, which is held against said one opposed inner wall of the cavity, is provided with indicia.

5. The method of claim 1 further comprising the step of providing said memory element with means for recording identification information.

6. A method for producing a memory card including an electronic module and a card body having first and second main faces comprising the steps of:

providing a photographic substrate with the same peripheral dimensions as said main faces and having a sensitive face and an opposed face;

providing a mold with a cavity which has the shape of the card body to be made, and with opposed inner walls of said cavity forming said first and second main faces of the card body;

disposing said photographic substrate in the cavity of said mold in such a manner that its sensitive face is held against the one of said opposed inner walls of the cavity that defines the first main face of the card body;

disposing said electronic module in the cavity of said mold in such a manner that its access face is held against the one of said opposed inner walls of the cavity which defines the second main face of the card body;

injecting a plastic material under pressure into the mold in such a manner that it fills the entirety of said cavity and that it adheres to the opposed face of the photographic substrate; and unmolding the object thus obtained.

7. The method of claim 6, wherein in addition to the electronic module having said access face it also is provided with an opposed posterior face and wherein said disposing step comprises affixing said electronic module by its said posterior face on the opposed face of said photographic substrate and placing the unit thus constituted into the mold.

8. The method of claim 7, wherein said photographic substrate is of the fast-development type and includes a developing paper, a photographic film, and a protection element sequentially stacked on one another, said photographing film and said protection element being detachable from said developing paper.

9. The method of claim 8, wherein said plastic injection material is transparent, and the back of said developing paper, which is held against said one opposed inner wall of the cavity, is provided with indicia.

10. The method of claim 6 further comprising the step of providing said memory element with means for recording identification information.

11. A memory card capable of receiving a photographic image, comprising:

a card body having first and second main, substantially parallel opposed faces;

an electronic module having an access face, said electronic module being affixed to said card body so that its access face is substantially in the plane of the first main face of the card body; and a photographic substrate having substantially the same peripheral dimensions as said main faces, having a sensitive face and an opposed posterior face, said substrate being affixed to the second main face of the card body by its said posterior face.

12. The memory card of claim 11, wherein said electronic module includes external electrical contact tabs disposed substantially in the plane of the first main face of the card body.

13. The memory card of claim 12, wherein said card body is made of a transparent plastic material, and the posterior face of the photographic substrate is provided with indicia.

14. The memory card of claim 11, wherein said card body is made of a transparent plastic material, and the posterior face of the photographic substrate is provided with indicia.

* * * * *